(12) United States Patent
Yamaguchi (10) Patent No.: US 7,193,301 B2
(45) Date of Patent: Mar. 20, 2007

(54) SEMICONDUCTOR DEVICE AND MANUFACTURING METHOD THEREOF

(75) Inventor: Tadashi Yamaguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 250 days.

(21) Appl. No.: 10/798,555

(22) Filed: Mar. 12, 2004

(65) Prior Publication Data

US 2005/0116324 A1 Jun. 2, 2005

(30) Foreign Application Priority Data

Nov. 28, 2003 (JP) ............... 2003-399373

(51) Int. Cl.
*H01L 23/02* (2006.01)

(52) U.S. Cl. .............. 257/678; 257/622; 257/618; 257/620; 257/621; 257/626; 257/684; 257/693; 257/723; 257/734

(58) Field of Classification Search ........... 257/678, 257/622, 618, 620, 621, 626, 684, 693, 723, 257/734
See application file for complete search history.

(56) References Cited

U.S. PATENT DOCUMENTS 6,303,470 B1  10/2001  Ohsumi et al.
6,548,895 B1 *  4/2003  Benavides et al. .......... 257/712

FOREIGN PATENT DOCUMENTS

| JP | 2000-243901 | 9/2000 |
|---|---|---|
| JP | 2000-260733 | 9/2000 |
| JP | 2003-258157 | 9/2003 |

* cited by examiner

*Primary Examiner*—Douglas W. Owens
*Assistant Examiner*—Junghwa Im
(74) *Attorney, Agent, or Firm*—Rabin & Berdo, PC (57) ABSTRACT

A plurality of semiconductor chips (14) each having a first main surface (14b) formed with electrode pads (21) and a second main surface (14c) opposite to the first main surface are respectively mounted on a chip mounting surface (12a) larger in area than the second main surface, of a wafer-shaped mounting substrate (12) at equal intervals so as to extend along first and second trenches (18a, 18b) defined in the chip mounting surface with these trenches as target lines. Thereafter, solder balls (25) electrically connected to the electrode pads of the semiconductor chips are disposed on their corresponding wiring patterns 34 that extend from above first regions (100) located above the semiconductor chips, of a surface region of an encapsulating layer (32) covering the semiconductor chips to above second regions (200) that surround the first regions. Afterwards, the encapsulating layer and the mounting substrate are cut and thereby fractionized into semiconductor devices each having a fan-out structure.

13 Claims, 6 Drawing Sheets

SEMICONDUCTOR DEVICE AND MANUFACTURING METHOD THEREOF

BACKGROUND OF THE INVENTION

1. Field of the Invention

The present invention relates to a semiconductor device having a fan-out structure and a manufacturing method thereof.

This application is counterpart of Japanese patent application, Serial Number 399373/2003, filed Nov. 28, 2003, the subject matter of which is incorporated herein by reference.

2. Description of the Related Art

The need to scale down and thin an outer size (package size) of a semiconductor device mounted to an electronic equipment such as a portable device has been increasing in recent years. With its demand, there has been proposed a CSP (Chip Size Package) corresponding to a semiconductor device on which packaging is effected in substantially the same outer size as an outer size of a semiconductor chip.

In terms of a reduction in manufacturing cost, attention is now given, as one form of CSP, to a WCSP (Waferlevel Chip Size Package) obtained by fractionization by use of dicing or the like after processes up to an external terminal forming process have been completed in a wafer state (see a patent document 1, for example).

A further reduction in semiconductor chip has been required with respect to the demand for an improvement in the collected number of chips per wafer, and the like with a view to further scaling down a recent electronic equipment and reducing its manufacturing cost.

However, the WCSP had a fan-in structure wherein since the area of a packaging or mounting surface on which external terminals were disposed, was identical to the area of the semiconductor chip, the external terminals were disposed inside electrode pads formed in the peripheral edge of the surface of the semiconductor chip.

In the WCSP having such a fan-in structure, the number of external terminals capable of being disposed on the mounting surface is limited. Therefore, there was a need to narrow the interval, i.e., array pitch between the adjacent external terminals in order to achieve a further reduction in semiconductor chip while a given predetermined number of external terminals are being maintained.

As a result, there has been fear that since the routing of wirings from the electrode pads on the semiconductor chip to the external terminals narrow in array pitch becomes complicated, degradation in product yield and the like occur.

Therefore, there has been proposed a WCSP having a fan-out structure, wherein the area of a mounting surface on which external terminals are disposed, is made wider than that of the surface of a semiconductor chip, and the external terminals are disposed outside electrode pads formed in the peripheral edge of the surface of the semiconductor chip (see a patent document 2, for example).

It was, however, difficult to form a wiring in desired position with satisfactory accuracy in the case of the formation of the wiring subsequent to a resin encapsulating process in each WCSP described up to now. This is because it is difficult to control with satisfactory accuracy as designed, the relationship of layout between the position of a mask pattern for patterning the wiring and the positions of plural semiconductor chips.

Meanwhile, in order to ensure alignment accuracy at the superposition of a pair of semiconductor elements, there is known a configuration wherein alignment trenches are provided in opposite surfaces of the semiconductor elements (see a patent document 3, for example).

Patent Document 1

Japanese Laid Open Patent No. 2000-260733

Patent Document 2

Japanese Laid Open Patent No. 2003-258157

Patent Document 3

Japanese Laid Open Patent No. 2000-243901

Therefore, there has heretofore been a demand for mounting of a plurality of semiconductor chips on design desired positions with satisfactory accuracy prior to a resin encapsulating process upon forming a wiring in a desired position with satisfactory accuracy in a WCSP. However, the above patent document 2 does not propose such a technique specifically.

On the other hand, although the patent document 3 discloses the alignment trenches used upon superposing the semiconductor chips on one another, it does not originally belong to such a technique that the superposed plural semiconductor elements are fractionized into individual semiconductor devices, (packages). Thus, the technical aspect that the distances (intervals) among a plurality of semiconductor chips prior to a resin encapsulating process are kept like designed values with satisfactory accuracy in consideration of a wiring forming process and a fractionizing process to be executed later, does not exist in the patent document 3.

SUMMARY OF THE INVENTION

Therefore, it is a principal object of the present invention to provide a semiconductor device having a high reliable fan-out structure capable of relaxing an interval (pitch) between external terminals, and a manufacturing method thereof.

According to one aspect of the present invention (this aspect is referred to as aspect 1), there is provided a method of manufacturing a semiconductor device which includes preparing a mounting substrate having a chip mounting surface, forming a plurality of target lines parallel with one another on the chip mounting surface, preparing a plurality of semiconductor chips each having sides shorter than an interval between the adjacent target lines, and a first main surface formed with electrode pads and a second main surface opposite to the first main surface, mounting the plurality of semiconductor chips on the chip mounting surface such that the second main surfaces are disposed face to face with one another among the target lines on-the chip mounting surface and mounting the semiconductor chips with being spaced away from one another along one target lines of the respective adjacent two target lines, forming an encapsulating layer on the chip mounting surface so as to cover the plurality of semiconductor chips, forming wiring patterns electrically connected to the electrode pads and extending from above first regions of a surface region of the encapsulating layer, which are located above the semiconductor chips, to above second regions located among the semiconductor chips, forming external terminals on the surfaces of the wiring patterns located on the second regions, and cutting the encapsulating layer and the mounting substrate in the second regions to bring the semiconductor chips into fractionization.

Furthermore, following various aspects with respect to the method of manufacturing a semiconductor device are disclosed in the specification. These aspects are as follows.

A method according to the aspect 1, wherein in said step for mounting the semiconductor chips on the chip mounting surface, the plurality of semiconductor chips are mounted with the sides thereof aligned with the one target lines. (Aspect 2)

A method according to the aspect 1, wherein in said step for mounting the semiconductor chips on the chip mounting surface, the plurality of semiconductor chips are mounted with the sides thereof being respectively spaced a predetermined distance from the one target lines. (Aspect 3)

A method according to the aspect 1, wherein the target lines comprise first target lines parallel with one another and second target lines that intersect at right angles to the first target lines respectively, and the one target lines in said step for mounting the semiconductor chips on the chip mounting surface are either the first target lines or the second target lines. (Aspect 4)

A method according to aspect 4, wherein in said step for mounting the semiconductor chips on the chip mounting surface, the corner of said each semiconductor chip is mounted in alignment with the corner of the chip mounting surface, which is formed by causing the first and second target lines to intersect.(Aspect 5)

A method according to aspect 4, wherein in said step for mounting the semiconductor chips on the chip mounting surface, the semiconductor chips are mounted with being shifted in parallel with respect to the first and second target lines respectively. (Aspect 6)

A method according to aspect 1, wherein the target lines are respectively trenches defined in the chip mounting surface. (Aspect 7)

A method according to aspect 1, wherein the target lines are respectively portions that protrude from the chip mounting surface. (Aspect 8)

Furthermore, according to another aspect of the present invention, there is provided a semiconductor device which includes a semiconductor chip having a first main surface formed with electrode pads and a second main surface opposite to the first main surface;

a mounting substrate having a chip mounting surface which has an area wider than an area of the second main surface and is opposed face to face with the second main surface, said mounting substrate having the semiconductor chip mounted thereon;

an encapsulating layer formed on the chip mounting surface so as to cover the semiconductor chip;

wiring patterns electrically connected to the electrode pads and extending from above a first region located above the semiconductor chip, of a surface region of the encapsulating layer to above a second region that surrounds the first region; and external terminals disposed on the surfaces of the wiring patterns located on the second region, wherein trenches extending between a pair of opposite side surfaces of the mounting substrate are defined in the chip mounting surface of the mounting substrate, and the encapsulating layer is formed in the trenches.

According to the present configuration, a semiconductor device having a fan-out structure wherein external terminals are disposed in regions other than directly above a semiconductor chip, can be realized.

As a result, since a mounting surface on which the external terminals are disposed, is made wide, it is possible to relax narrowing of an array pitch between the external terminals with the scaling down of the semiconductor chip. Thus, since the difficulty of routing wirings extending from the electrode pads to the external terminals is relaxed, degradation in product yield can be suppressed.

Further, according to the present configuration, since the semiconductor chips can be mounted so as to extend along first target lines (or called also reference lines) formed in the mounting substrate, the semiconductor chips can be mounted with satisfactory accuracy as compared with the case in which the semiconductor chips are mounted without using the target lines.

Thus, since the semiconductor chip can be mounted to a design desired position with satisfactory accuracy, each wiring can be formed at its desired position with satisfactory accuracy upon-formation of the wiring after its mounting, thus making it possible to suppress degradation in product yield.

Further, according to the present configuration, trenches that function as target lines carry out even the function of improving adhesion between the encapsulating layer and the semiconductor chip. Thus, in the semiconductor devices individualized via the fractionizing process, the encapsulating layer can be prevented from being peeled from the surface of each semiconductor chip.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Embodiments of the present invention will be described hereinbelow with reference to the accompanying drawings. Incidentally, the respective drawings merely roughly show the sizes, shapes and positional relationships of respective components to such a degree that the present invention can be understood. Accordingly, the present invention is not limited to the illustrated embodiments. In order to make it easy to understand the drawings, hatching for showing sections are omitted except for parts. Incidentally, the embodiments described below are simply preferred examples and illustrated numerical conditions are by no means limited to these. In the respective drawings, similar components are respectively identified by the same reference numerals and the description of common components might be omitted.

Figure 1A:
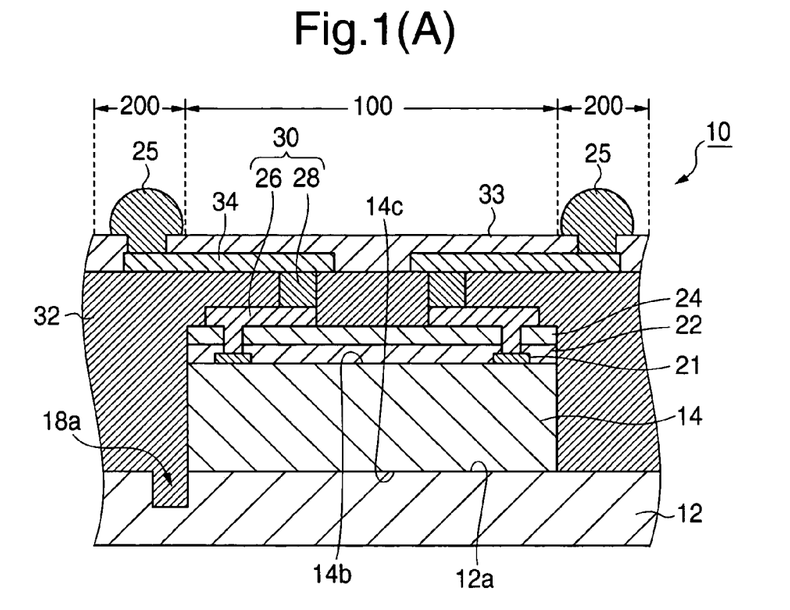
FIG. 1(A) is a schematic sectional view showing a semiconductor device according to an embodiment of the present invention.
Figure 1B:
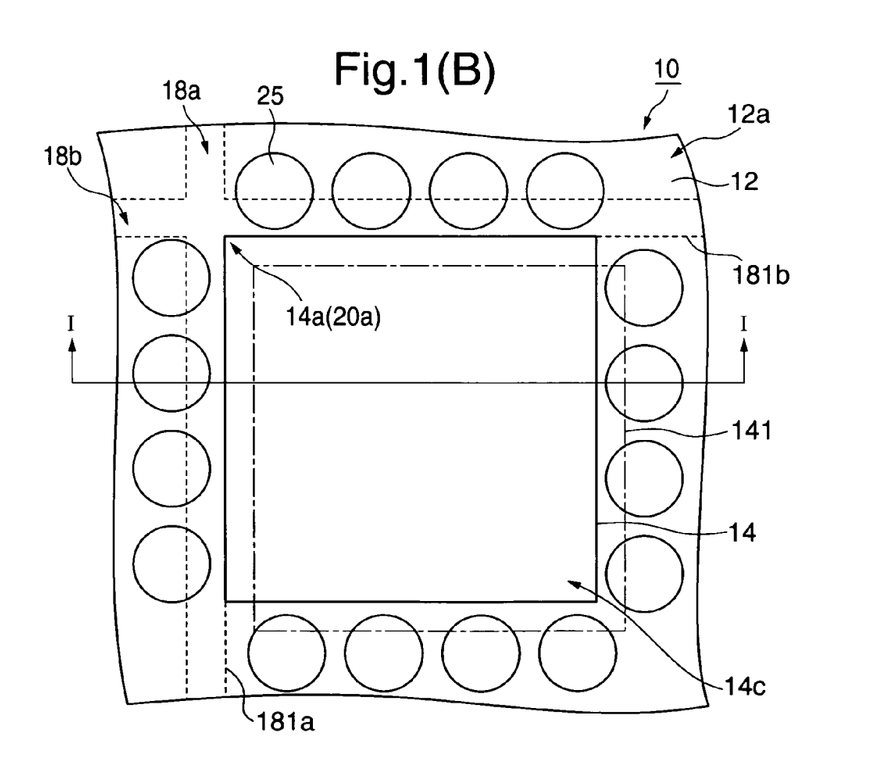
FIG. 1(B) is a schematic plan view illustrating the semiconductor device according to the embodiment of the present invention.

A semiconductor device according to an embodiment of the present invention and a manufacturing method thereof will be explained with reference to FIGS. 1 through 6. FIG. 1(A) is a view for describing the semiconductor device according to the present embodiment and is a schematic view showing a cut area (section) obtained by cutting FIG. 1(B) along line I—I of a broken line portion in FIG. 1(B). FIG. 1(B) is a view for describing the semiconductor device according to the present embodiment and is a schematic plan view typically showing its principal part.

In the semiconductor device 10 shown in FIG. 1(A), a semiconductor chip 14 is mounted on a chip mounting surface 12a of a substrate 12 for mounting the semiconductor chip. The chip mounting surface 12a is one main surface of the mounting substrate 12 and a surface larger than an outer dimension of the mounted surface of the semiconductor chip 14. The semiconductor chip 14 includes required circuit elements (not shown) formed on a silicon (Si) substrate used as a semiconductor substrate. Also the semiconductor chip 14 has a first main surface 14b and a second main surface 14c opposite to the first main surface 14b. The first main surface 14b corresponds to an electrode pad forming surface and electrode pads 21 are formed on the first main surface 14b. On the other hand, the second main surface 14c is a surface unformed with the electrode pads and is a mounted surface on the side of mounting of the semiconductor chip on the mounting substrate 12. The second main surface 14c of the semiconductor chip 14 is fixed to the chip mounting surface 12a of the mounting substrate 12 by a dice bonding adhesive (not shown). Incidentally, the material used for the mounting substrate 12 may preferably be silicon identical to the material for the semiconductor substrate. This is because stress concentration caused by the difference in thermal expansion coefficient between the mounting substrate 12 and the semiconductor chip 14 can be relaxed. The electrode pads 21 are formed of aluminum (Al).

In this configurational example, first and second trenches (only a first trench 18a is illustrated here) that reach a depth located midway through the mounting substrate 12 as viewed from the chip mounting surface 12a are defined in the chip mounting surface 12a as first and second target lines. The semiconductor chip 14 is mounted on the mounting substrate 12 so as to run parallel to the edges of these trenches along the edges of the trenches, i.e., with the edges of the trenches as the reference (this will be described later). Also the first and second target lines are respectively provided in parallel at even intervals. An area surrounded by the two first target lines and two second target lines adjacent to one another is defined as a chip mounting surface region of one semiconductor chip.

A passivation film 22 and a protective film 24 are sequentially laminated over the first main surface 14b of the semiconductor chip 14 so as to cover the first main surface 14b and expose the surfaces of the electrode pads 21. The passivation film 22 is formed of a silicon oxide film ($SiO_2$). The protective film 24 is a layer which serves so as to suppress peeling of the semiconductor chip 14 and a sealing or encapsulating layer 32 to be described later and is formed of a polyimide resin.

The electrode pads 21 and solder balls 25 are electrically connected to one another through conductive units 30 and wiring patterns (or called also wiring layers) 34, respectively.

Each of the conductive units 30 includes a first conductive section 26 and a second conductive section 28. The first conductive sections 26 are formed from above the electrode pads 21 to above the protective film 24. Each of the second conductive sections 28 is also called post section. The second conductive section 28 is connected to its corresponding first conductive section 26 at a predetermined position on the first conductive section 26 and protrudes in the direction orthogonal to the first main surface 14b. The first conductive section 26 functions as a redistribution wiring layer for relocating the second conductive section 28 in a desired position above the semiconductor chip 14. These first and second conductive sections (26 and 28) are respectively formed of copper (Cu).

The encapsulating layer 32 is provided over the upper entire surface of the mounting substrate 12 containing the above-described respective constituent members of semiconductor chip 14, first conductive sections 26 and second conductive sections 28 except for the top faces of the second conductive sections 28. The encapsulating layer 32 is formed so as to cover the above-mentioned constituent members with such a thickness as to expose the top faces of the second conductive sections 28. The wiring layers 34 are provided on the encapsulating layer 32.

The wiring layer 34 has one end connected to the top face of the second conductive section 28 and the other end formed in a second region 200 of a surface region of the encapsulating layer 32, which is located outwardly of a first region 100 corresponding to a directly-above region opposed to the semiconductor chip 14. Thus, the wiring layer 34 corresponding to the wiring pattern is formed so as to range from the first region 100 of the surface region of the encapsulating layer 32, which is located above the semiconductor chip 14 and opposite to the first main surface 14b, to the second region 200 which is located above a region lying outside the peripheral edge of the first main surface 14b of the semiconductor chip 14 and surrounds the first region 100. The encapsulating layer 32 is formed of an epoxy resin and has an upper surface which is flat.

A surface protective film 33 is provided on the encapsulating layer 32. The surface protective film 33 that covers the encapsulating layer 32 has openings for exposing parts of the wiring layers 34, which are provided in the second regions 200 of the encapsulating layer 32. Then, the solder balls 25 are provided on their corresponding surface regions of the wiring layers 34, which are exposed through the openings. Each of the wiring layers 34 functions as a redistribution wiring layer for relocating each solder ball 25 in a desired position of the surface region of the encapsulating layer 32 and is formed of copper. The surface protective film 33 is formed of the polyimide resin.

Thus, the semiconductor device 10 according to such a configurational example has a fan-out structure in which the solder balls 25 are disposed in their corresponding surface region portions of the encapsulating layer 32 other than directly above the semiconductor chip 14, i.e., the second regions 200 corresponding to the regions lying outside the first region 100 opposite to the first main surface 14b.

A description will subsequently be made, in further details, of positions to mount the semiconductor chip 14 of the semiconductor device 10 having such a fan-out structure with reference to FIG. 1(B).

In the present configurational example, as shown in FIG. 1(B), the second main surface corresponding to the back surface of the rectangular semiconductor chip 14, i.e., one corner 14a of the mounted surface 14c is mounted so as to substantially coincide or overlap with one corner 20a formed in the chip mounting surface 12a of the mounting substrate 12. Incidentally, the substantial coincidence includes not only a state in which the corner 14a included in the semiconductor chip 14 and the corner 20a formed in the mounting substrate perfectly coincide with each other, but also a state in which they are slightly shifted within an error range of such a degree that an effect similar to the case where both the corners (14a and 20a) have coincided with each other, is obtained.

The corner 20a described herein corresponds to a portion where the first and second trenches (18a and 18b) corresponding to the first and second target lines intersect each other. Here, the angle at which they intersect is a right angle (90°).

In the present configurational example, the state in which the corner 14a included in the semiconductor chip 14 and the corner 20a formed in the mounting substrate substantially coincide with each other, is obtained. That is, the two sides that form the corner 14a of the second main surface 14c of the semiconductor chip 14 are substantially superimposed on their corresponding edges (181a and 181b) of the first and second trenches (18a and 18b) that form the corner 20a. Incidentally, the mounting position of the semiconductor chip 14 is not limited to only the position where the corner 14a coincides with the above corner 20a. Thus, in addition to the above, as virtually shown by a dashed line in FIG. 1(B), the semiconductor chip 14 may be mounted to positions where it is spaced a predetermined distance from the edges (181a and 181b) of the first and second trenches (18a and 18b) that form the corner 20a, respectively. That is, the semiconductor chip may be mounted to positions wherein it is shifted in parallel to the edges of the trenches in a region outside the trenches, of the chip mounting surface. Described specifically, the semiconductor chip 14 may be mounted to parallel-shifted positions in such a manner that the distances from the first and second edges (18a and 18b) become equal to each other or the distances therefrom become different from each other.

Figure 2:
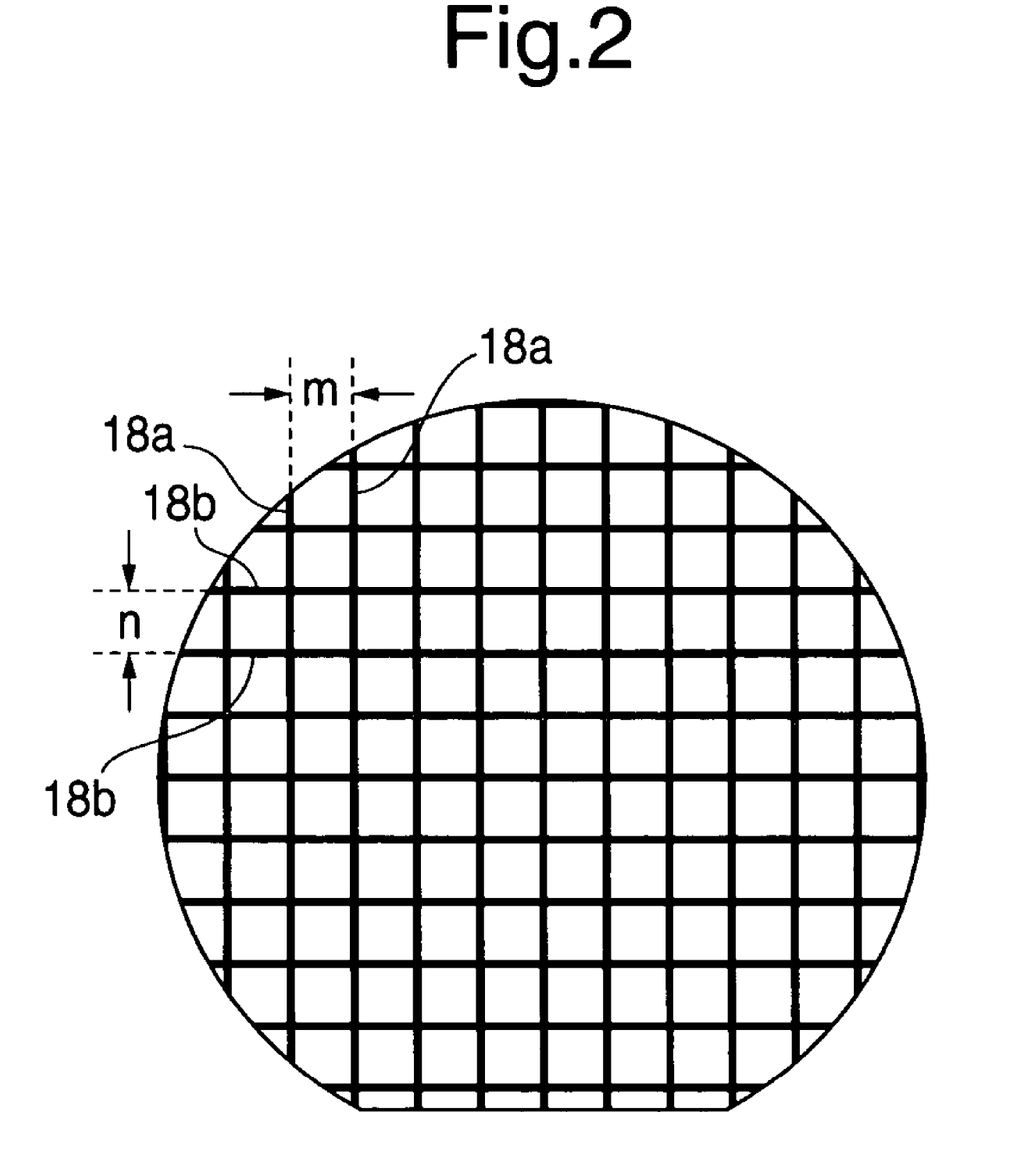
FIG. 2 is a schematic plan view (part 1) for describing a manufacturing process of the semiconductor device according to the embodiment of the present invention.
Figure 3A:
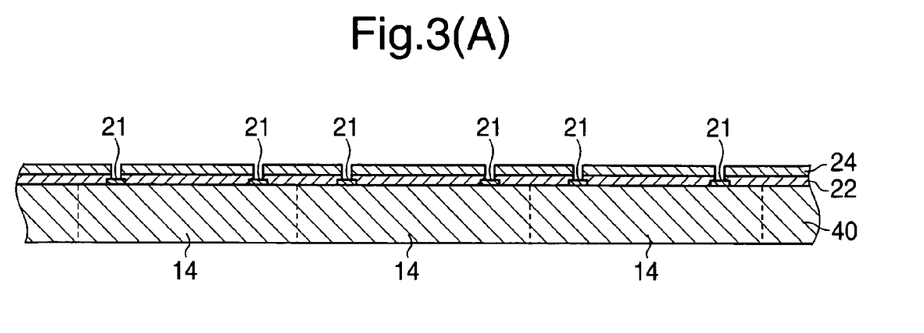
FIGS. 3(A) through 3(C) are respectively schematic sectional views (part 2) for describing the manufacturing process of the semiconductor device according to the embodiment of the present invention.
Figure 3B:
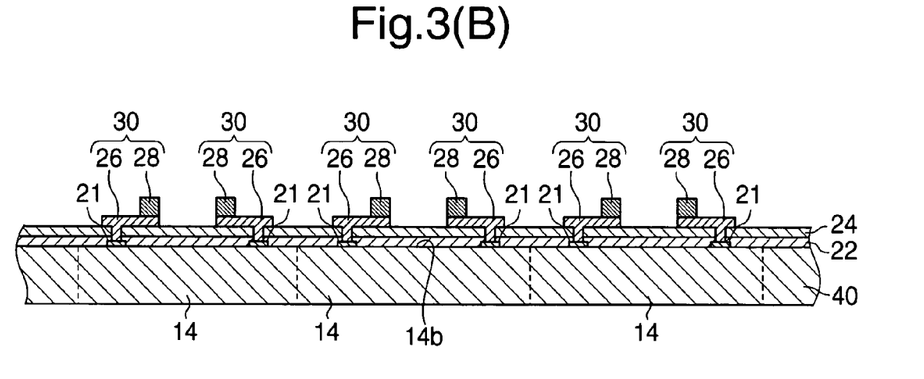
Figure 3C:
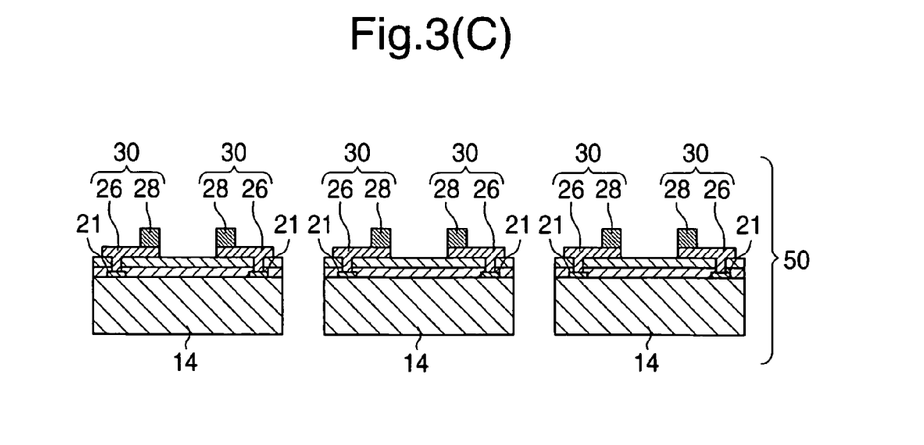
Figure 4A:
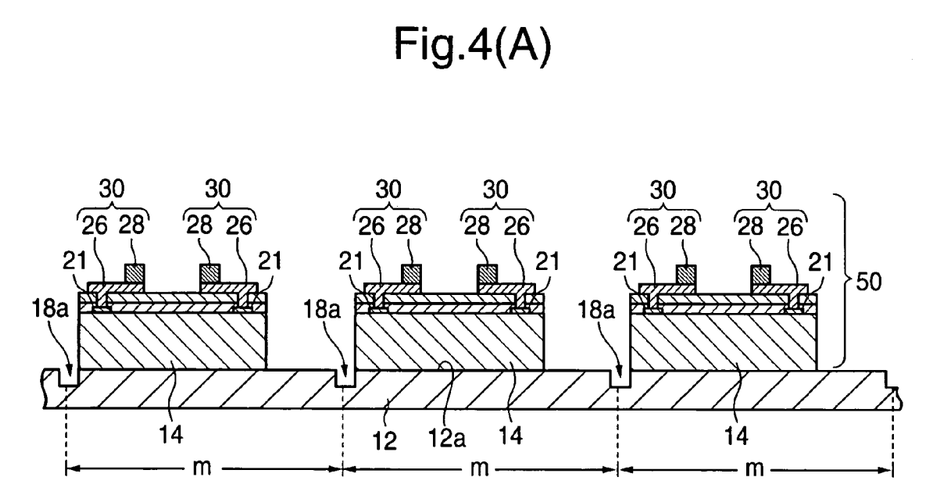
FIGS. 4(A) and 4(B) are respectively a schematic sectional view and a schematic plan view (part 3) for describing the manufacturing process of the semiconductor device according to the embodiment of the present invention.
Figure 4B:
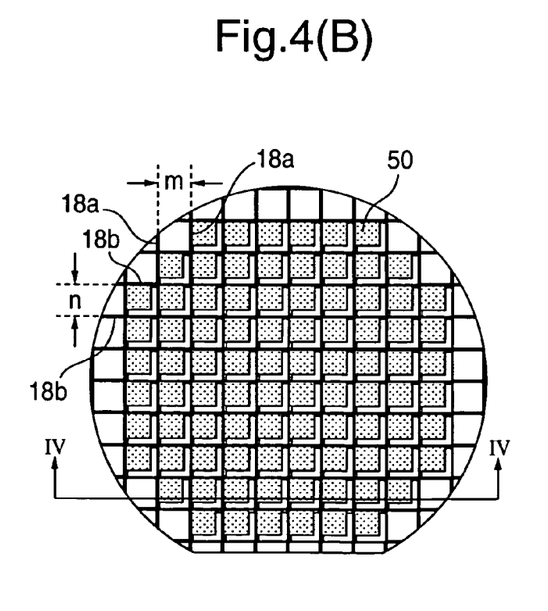
Figure 5A:
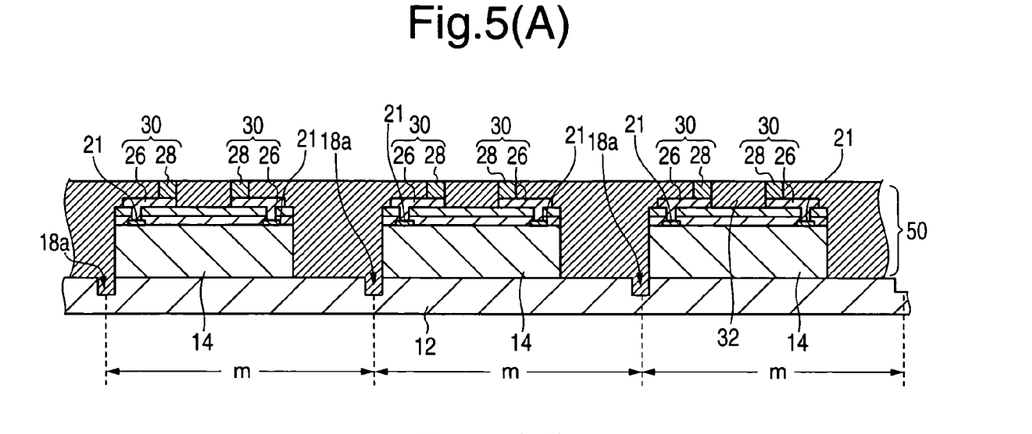
FIGS. 5(A) through 5(C) are respectively schematic sectional views (part 4) for describing the manufacturing process of the semiconductor device according to the embodiment of the present invention.
Figure 5B:
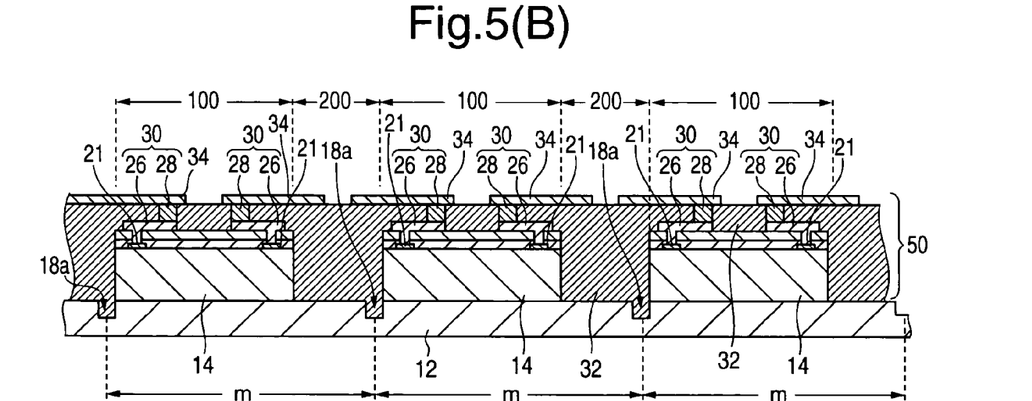
Figure 5C:
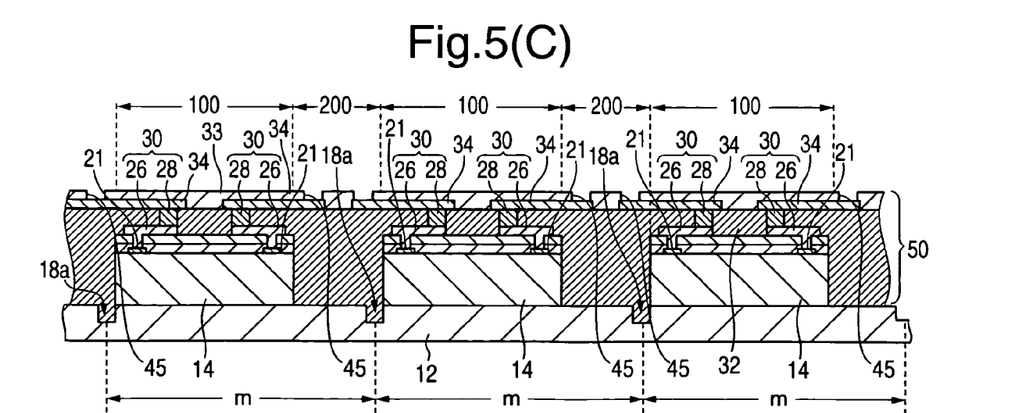
Figure 6:
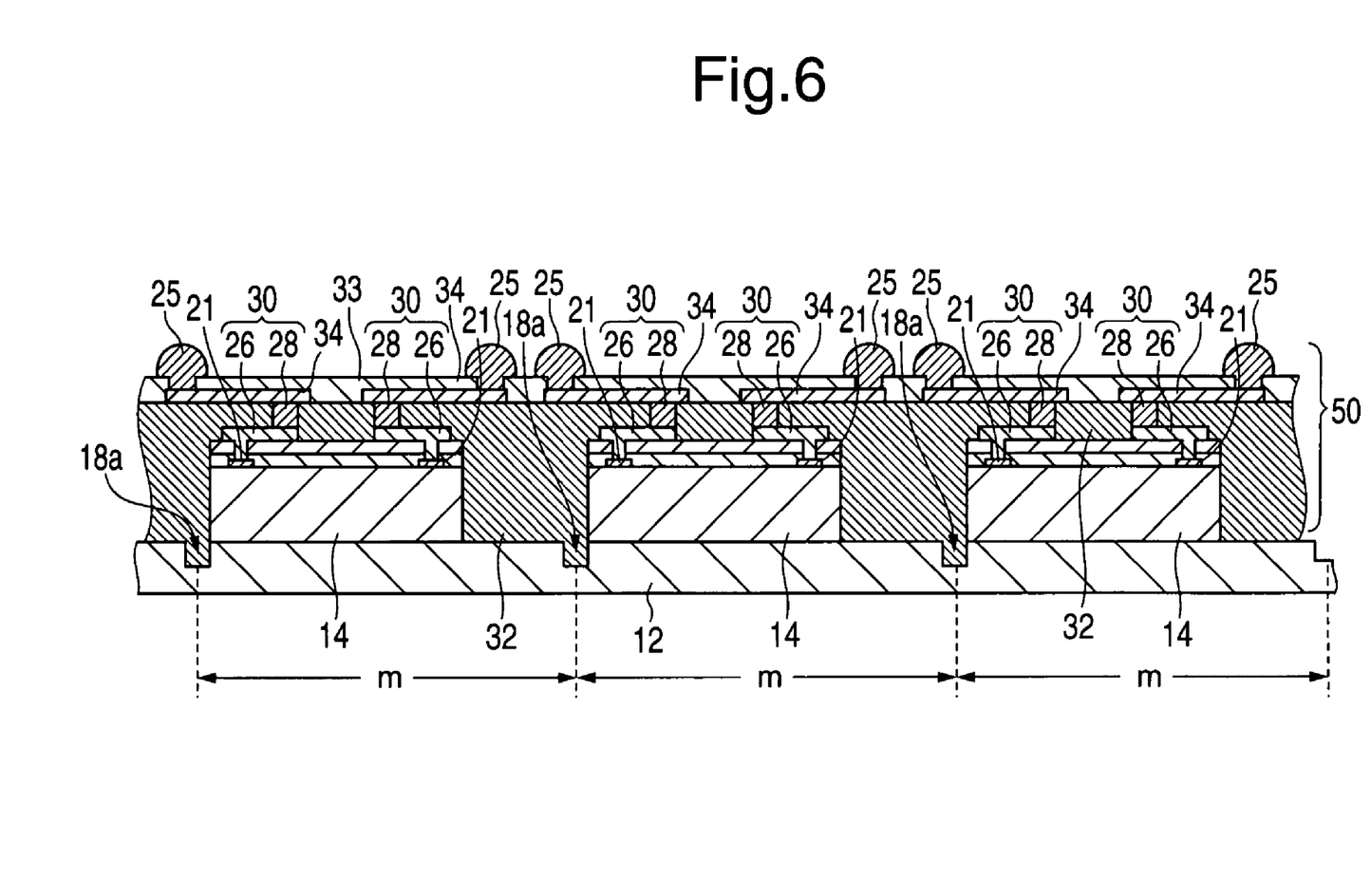
FIG. 6 is a schematic sectional view (part 5) for describing the manufacturing process of the semiconductor device according to the embodiment of the present invention.

Subsequently, a method of manufacturing the semiconductor device 10 will be explained below with reference to FIGS. 2 through 6. FIG. 2 is a schematic plan view showing a mounting substrate subsequent to a target line forming process. FIGS. 3, 5 and 6 are respectively schematic sectional views for describing a semiconductor device manufacturing process. FIG. 4(A) is a schematic sectional view as seen in the direction indicated by arrows in the figure, of a cut area obtained by cutting FIG. 4(B) showing a schematic plan view of the mounting substrate subsequent to a mounting process, along line IV—IV of a broken line portion in FIG. 4(B). Incidentally, the mounting substrate 12 will be explained below as a semiconductor wafer.

As the target line forming process, first trenches 18a each used as a first target line, and second trenches 18b each used as a second target line, which respectively intersect the first trenches 18a, are first defined in a chip mounting surface 12a of a mounting substrate 12. In the present embodiment, the angle at which they intersect, is set as 90°.

As shown in FIG. 2, the first trenches 18a are first defined in the chip mounting surface 12a of the mounting substrate 12 having a predetermined size, in the form of stripes or in stripe form such that the distance between the adjacent trenches becomes m. The first trenches 18a can be linearly formed between a pair of opposite side surfaces of the mounting substrate by half dicing using a dicing blade. The interval described here, i.e., arrangement pitch m is set longer than the length of each side lying in the direction (array direction) in which the first trenches 18a of a semiconductor chip 14 are arranged.

After the formation of the first trenches 18a, the second trenches 18b each used as the second target line, which respectively intersect the first trenches 18a (which are respectively orthogonal to the first trenches 18a here), are formed in stripe form in such a manner that the distance between the adjacent trenches becomes n. The second trenches 18b can also be linearly formed by half dicing using the dicing blade. The interval described here, i.e., arrangement pitch n is set longer than the length of each side in the direction (array direction) in which the second trenches 18b of the semiconductor chip 14 are arranged.

The formation of the first and second trenches (18a and 18b) can be done using an arbitrary suitable method such as etching in addition to the above-described cutting method using the dicing blade. In the case of etching, wet etching can be utilized which makes use of an etchant containing a strong alkaline solution such as potassium hydroxide (KOH), tetra methyl ammonium hydroxide (TMAH) or the like.

Thus, the mounting substrate 12 can be formed with the first and second trenches (18a and 18b) corresponding to lattice-shaped trenches, which function as target lines (called also reference lines) for mounting of the semiconductor chip in a subsequent process.

As a mounting process, each semiconductor chip 14 is next mounted on the chip mounting surface 12a of the mounting substrate 12. In the present configurational example, laminated bodies 50 with semiconductor chips 14 as constituent parts are mounted on the mounting substrate 12. Therefore, the formation of the laminated bodies 50 will be carried out in the following procedure prior to the mounting process (semiconductor chip preparing process).

First, a wafer 40 provided with a plurality of semiconductor chips 14 formed with circuit elements by a wafer process such as normal impurity diffusion processing for a semiconductor substrate is prepared.

Then, a passivation film 22 made up of a silicon oxide film, and a protective film 24 made of a polyimide film are sequentially formed on the entire surface of the wafer 40 so as to expose the surfaces of electrode pads 21. Incidentally, although three semiconductor chips 14 are illustrated for convenience in the figure, the number thereof is not limited to three (see FIG. 3(A)).

Subsequently, a copper film is formed by copper sputter or the like so as to cover these from the side above the protective film 24 inclusive of the surfaces of the electrode pads 21. Thereafter, a photolithography process is effected on the copper film to form first conductive sections 26 in regions directly above the chips by patterning. Afterwards, second conductive sections made of copper, i.e., post sections 28 are formed in predetermined positions on the first conductive sections 26 by an electrolytic plating method or the like. Thus, conductive units 30, which protrude in the direction orthogonal to their corresponding main surfaces 14b of the semiconductor chips 14, are respectively formed on the first main surfaces 14b of the semiconductor chips 14 (see FIG. 3(B)).

Subsequently, the wafer 40 is fractionized into individual semiconductor chips 14 by using a dicing blade, thereby leading to completion of the laminated bodies 50 for mounting on the mounting substrate 12 (see FIG. 3(C)).

Next, the laminated bodies 50 obtained in this manner are mounted one by one within regions surrounded by the first and second trenches (18a and 18b) of the chip mounting surface 12a.

In the present configurational example, as shown in FIGS. 4(A) and 4(B), the above-described first and second trenches (18a and 18b) are utilized as target lines (or called also reference lines) for mounting the laminated bodies 50 with the semiconductor chips to predetermined positions.

The present configurational example explains a case in which each semiconductor chip 14 is mounted on the mounting substrate 12 in such a manner that one of corners 14a of a second main surface 14c of the semiconductor chip 14 substantially coincides or matches with one corner 20a of the chip mounting surface 12a at which the first and second trenches (18a and 18b) intersect. Incidentally, the substantial coincidence includes not only a state in which the corner 14a included in each semiconductor chip 14 and the corner 20a formed in the mounting substrate perfectly coincide with each other, but also a state in which they are slightly shifted within an error range of such a degree that an effect similar to the case where both the corners (14a and 20a) are matched with each other, is obtained.

The corner 20a described herein indicates a corner region of a chip mounting region formed by crossing the first and second trenches 18a and 18b. An upper left-hand corner 20b as viewed in the sheet, of the four corners of the chip mounting region surrounded by the edges of the first and second trenches (18a and 18b) will be explained here as one example.

Therefore, a semiconductor chip 14 is mounted on the mounting substrate 12 in such a manner that the two sides forming the corner 14a of the second main surface (mounted surface) 14c of the semiconductor chip 14 respectively overlap with the edges of the first and second trenches (18a and 18b) forming the corner 20a, which are used as target lines. At this time, the second main surface 14c of the semiconductor chip 14 and the chip mounting surface 12a of the mounting substrate 12 are fixed by, for example, a dice bonding adhesive (not shown).

The setting of a mounting position of each semiconductor chip 14 using the first and second trenches (18a and 18b) can be performed using, for example, a known general image recognition process. In this case, information related to trenches is extracted from image information about a mounting substrate, which is obtained by a camera, and the position to mount each semiconductor chip can be set based on the information related to-the trenches.

As a method for setting the position to mount each semiconductor chip without using such target lines, may be mentioned, for example, a general alignment method using linear cut-away portions (orientation flats) or wedge-like notches defined in the outer periphery of the mounting substrate 12. However, such an alignment method with the orientation flats or notches as standards encounters difficulties in obtaining high alignment accuracy required of microfabrication. This is because an error is apt to occur upon alignment at positions away from the orientation flats or notches since the alignment using the orientation flats or notches is done by image recognition or the like with only the positions of the orientation flats or notches as standards.

On the other hand, as in the present configurational example, the position to mount the semiconductor chip can be accurately grasped by utilizing the trenches (18a and 18b) corresponding to the target lines defined in the mounting substrate 12 as reference lines for alignment upon image recognition. Therefore, high reliable alignment can be performed. Thus, since the alignment accuracy of each semiconductor chip is improved, the semiconductor chip 14 can be mounted on the mounting substrate 12 with satisfactory accuracy.

As a result, since the semiconductor chips can be mounted on design desired positions with satisfactory accuracy, mask patterns can be placed in desired positions upon wiring formation subsequent to a resin encapsulating process. Thus, it is possible to form wirings in desired positions as designed with satisfactory accuracy.

Further, since the respective intervals (m and n) between the first and second trenches (18a and 18b) are longer than the length of each side of the semiconductor chip 14, the interval between the adjacent chips is uniformized.

As a result, the uniformization of outer dimensions of semiconductor devices cut out through an individualizing process to be described later can be reliably realized, so that a reduction in product yield can be expected.

Incidentally, while the configurational example shows a configuration wherein each semiconductor chip 14 is mounted on the mounting substrate 12 such that the corner 14a of the semiconductor chip coincides with one corner 20a formed by the first and second trenches (18a and 18b), the present invention is not limited to such a configuration.

Thus, as already described above, for example, the semiconductor chip 14 may be mounted off to the positions where the two sides forming the corner 14a of the semiconductor chip 14 are spaced a predetermined distance from the edges (181a and 181b) of the first and second trenches (18a and 18b) forming the corner 20a (see FIG. 1(B)). That is, the semiconductor chip 14 can be mounted to parallel-shifted positions in such a manner that the distances from the first and second edges (18a and 18b) become equal to each other or the distances therefrom become different from each other.

Next, as an encapsulating layer forming process, an epoxy resin is applied from the upper side of the chip mounting surface 12a by spin coating or the like to form an encapsulating layer 32 with a thickness of such a degree that it covers the semiconductor chips and the second conductive sections 28 of the conductive units 30 are hidden from view (see FIG. 5(A)). Since the sealant or encapsulating material is charged even into the respective trenches (18a and 18b), the area where the encapsulating layer 32 and the mounting substrate 12 contact, increases. As a result, the encapsulating layer performs a high adhesive and anchor-based function. Accordingly, an improvement in reliability of each semiconductor device cut out via an individualizing process to be described later can be expected. The reliability described here means that, for example, the encapsulating layer 32 is hard to be peeled from the surface of the semiconductor chip 14. Incidentally, the first and second trenches (18a and 18b) are utilized as target lines for mounting the semiconductor chips 14 in the process of manufacturing the semiconductor devices. Since, however, the first and second trenches (18a and 18b) perform the function of improving the reliability of each individualized semiconductor device, the present invention is characterized by not only the manufacturing method but also the semiconductor device corresponding to the final structure.

Next, a wiring layer 34 corresponding to a wiring pattern electrically connected to the corresponding electrode pads 21 is formed as a wiring layer forming process.

Therefore, the encapsulating layer 32 is first polished by a grinder to expose the top faces of all the second conductive sections 28. Thereafter, a copper film is formed over the upper entire surface of the encapsulating layer 32 by a sputter or the like so as to cover the exposed top faces of the second conductive sections 28. Afterwards, a photolithography process is effected on the copper film to form the wiring layers 34 by patterning. At this time, the wiring layers 34 are formed so as to range from a first region 100 of a surface region of the encapsulating layer, which is opposite to a first main surface 14b of each semiconductor chip 14 to a second region 200 located between the adjacent semiconductor chips 14 (see FIG. 5(B)). Here, the first region 100 corresponds to a surface region portion located directly above the semiconductor chip 14, of the surface region of the encapsulating layer 32. Also the second region corresponds to a surface region portion which is located above a region lying outside the peripheral edge of the first main surface 14b of the semiconductor chip 14 and surrounds the first region 100.

Next, external terminals are formed on their corresponding surface region portions of the wiring layers 34 lying in the second regions 200.

Therefore, a layer made of a polyimide resin or the like is first formed over the entire surface of the encapsulating layer 32 so as to cover the wiring layers 34. Thereafter, a photolithography method is applied to the layer to thereby form openings 45 that expose the surfaces of the wiring layers 34. The insulating layer of the polyimide resin or the like in which the openings 45 are defined, forms a surface protective film 33 (see FIG. 5(C)). The openings 45 defined in the surface protective film 33 are located in the second region 200 of each semiconductor chip 14.

Thereafter, solder balls 25 used as the external terminals are formed by reflow on the wiring layers 34 exposed from the openings 45 (see FIG. 6). Incidentally, barrier metal layers or the like may be formed between the wiring layers 34 and the solder balls 25 as needed.

Subsequently, as an individualizing or fractionizing process, a dicing blade is used to cut between the respective solder balls connected to the adjacent semiconductor chips 14, thereby cutting out packages 10 corresponding to semiconductor devices (see FIG. 1(A)). After the processes up to an external terminal forming process have been completed while a wafer state is still held, the wafer is fractionized into pieces using the dicing blade, whereby the-side surfaces of the encapsulating layer 32 and the mounting substrate 12 result in sections cut by the dicing blade.

According to the semiconductor device of the present embodiment and its manufacturing method, as apparent from the above description, a fan-out structure can be realized wherein the solder balls 25 are disposed in the regions other than just above the semiconductor chips 14, i.e., the second regions 200 located above the regions outside the peripheral edges of the first main surfaces 14b of the semiconductor chips 14.

As a result, since the mounting surface on which the solder balls corresponding to the external terminals are disposed, can be made wider than the area of the surface of each semiconductor chip, it is possible to relax narrowing of an array pitch between the external terminals with the scaling down of the semiconductor chip. Thus, since the difficulty of routing wirings extending from the electrode pads to the external terminals is relaxed, degradation in product: yield can be suppressed.

Further, according to the present embodiment, since the semiconductor chips can be mounted so as to extend along the target lines formed in the mounting substrate, the semiconductor chips can be mounted with satisfactory accuracy as compared with the case in which the semiconductor chips are mounted without using the target lines.

Thus, since the semiconductor chip can be mounted to the design desired position with satisfactory accuracy, the wiring can be formed at its desired position with satisfactory accuracy upon formation of the wiring after its mounting, thus making it possible to suppress degradation in product yield.

Further, according to the present embodiment, the trenches that function as the target lines carry out the function of improving adhesion between the encapsulating layer and the semiconductor chip. Thus, in the semiconductor devices individualized via the fractionizing process, the encapsulating layer can be prevented from being peeled from the surface of each semiconductor chip.

As described above, the present invention is not limited to only the combination of the above embodiments. Thus, the present invention is applicable by utilizing suitable conditions in combination at an arbitrary suitable stage.

While the above-described embodiment has explained the case in which the target lines are set as the trenches, the target lines may take protruded forms. In this case, the protruded forms can be formed by application of an arbitrary suitable method such as a printing method.

While the above-described embodiment has explained the semiconductor device having the fan-out structure, one having a fan-in/fan-out structure may be adopted according to purposes and design. The fan-in/fan-out structure is a structure wherein external terminals are disposed even in a region directly above the surface of each semiconductor chip.

What is claimed is:

1. A semiconductor device comprising:
   a semiconductor chip having a first main surface formed with electrode pads and a second main surface opposite to the first main surface;
   a mounting substrate having a chip mounting surface which has an area wider than an area of the second main surface and is opposed in face to face contact with the second main surface, the semiconductor chip being mounted on said mounting substrate;
   an encapsulating layer formed on the chip mounting surface so as to cover the semiconductor chip;
   wiring patterns electrically connected to the electrode pads and extending in contact with the encapsulating layer from a first region to a second region, the first region being located on the surface of the encapsulating layer which is located above the semiconductor chip and the second region being located on the surface of the encapsulating layer which surrounds the first region;
   external terminals disposed on the surfaces of the wiring patterns located on the second region, and
   a first trench formed on the mounting surface and extending from a first side surface of the mounting substrate to a second side surface of the mounting substrate opposite to the first side surface of the mounting substrate, wherein the encapsulating layer is formed in the first trench.

2. A semiconductor device according to claim 1, wherein the semiconductor chip is mounted on the mounting substrate along the first trench.

3. A semiconductor device according to claim 1, wherein the semiconductor chip is mounted on the mounting substrate in alignment with the first trench.

4. A semiconductor device according to claim 1, wherein the semiconductor chip is mounted on the mounting substrate with being spaced a predetermined distance from the first trench.

5. A semiconductor device according to claim 1, wherein the side surfaces of the mounting substrate and the encapsulating layer are cut sections.

6. A semiconductor device according to claim 1, further comprising a second trench formed on the mounting surface and extending from a third side surface of the mounting substrate to a fourth side surface opposite to the third side surface of the mounting substrate.

7. A semiconductor device according to claim 6, wherein the corner of the semiconductor chip is mounted in alignment with the corner of the chip mounting surface, which is formed by causing the first and second trenches to intersect.

8. A semiconductor device according to claim 6, wherein the semiconductor chip is mounted with being shifted in parallel with respect to the first and second trenches respectively.

9. A semiconductor device comprising:
a semiconductor chip having a first main surface formed with electrode pads and a second main surface opposite to the first main surface;
a mounting substrate having a chip mounting surface which has an area wider than an area of the second main surface and is opposed face to face with the second main surface, the semiconductor chip being mounted on said mounting substrate;
an encapsulating layer formed on the chip mounting surface so as to cover the semiconductor chip;
wiring patterns electrically connected to the electrode pads and extending in contact with the encapsulating layer from a first region to a second region, the first region being located on the surface of the encapsulating layer which is located above the semiconductor chip and the second region being located on the surface of the encapsulating layer which surrounds the first region;
external terminals disposed on the surfaces of the wiring patterns located on the second region; and
a protruding portion formed on the mounting surface and extending from a first side surface of the mounting substrate to a second side surface of the mounting substrate opposite to the first side surface of the mounting substrate, wherein the protruding portion is covered with the encapsulating layer.

10. A semiconductor device according to claim 1, wherein the external terminals comprise solder balls.

11. A semiconductor device according to claim 9, wherein the external terminals comprise solder balls.

12. A semiconductor device according to claim 1, wherein the second region is located on the surface of the encapsulating layer above a portion of the mounting substrate outside of the semiconductor chip.

13. A semiconductor device according to claim 9, wherein the second region is located on the surface of the encapsulating layer above a portion of the mounting substrate outside of the semiconductor chip.

* * * * *